US012648376B2

(12) United States Patent
Dangerfield et al.

(10) Patent No.: US 12,648,376 B2
(45) Date of Patent: Jun. 2, 2026

(54) SELECTIVE TANTALUM NITRIDE DEPOSITION FOR BARRIER APPLICATIONS

(71) Applicant: Applied Materials, Inc., Santa Clara, CA (US)

(72) Inventors: Aaron Dangerfield, San Jose, CA (US); Jesus Candelario Mendoza-Gutierrez, San Jose, CA (US); Bhaskar Jyoti Bhuyan, San Jose, CA (US); Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 18/109,493

(22) Filed: Feb. 14, 2023

(65) Prior Publication Data

US 2023/0197438 A1 Jun. 22, 2023

Related U.S. Application Data

(60) Continuation-in-part of application No. 17/873,793, filed on Jul. 26, 2022, now Pat. No. 12,131,900, (Continued)

(51) Int. Cl.
*C23C 16/00* (2006.01)
*C23C 16/02* (2006.01)
(Continued)

(52) U.S. Cl.
CPC .... *H10P 14/69433* (2026.01); *C23C 16/0245* (2013.01); *C23C 16/308* (2013.01);
(Continued)

(58) Field of Classification Search
CPC ...................................................... C23C 16/00
See application file for complete search history.

(56) References Cited

U.S. PATENT DOCUMENTS 7,994,640 B1 8/2011 Alers et al.
2003/0049460 A1 3/2003 O'Neill et al.
(Continued)

FOREIGN PATENT DOCUMENTS

JP 2010540773 A 12/2010
KR 20070095919 A 10/2007
(Continued)

OTHER PUBLICATIONS

Non-Final Office Action in U.S. Appl. No. 17/873,793 dated Apr. 22, 2024, 10 pages.
(Continued)

*Primary Examiner* — Gordon Baldwin
*Assistant Examiner* — Mohammad Mayy
(74) *Attorney, Agent, or Firm* — Servilla Whitney LLC

(57) ABSTRACT

Methods of forming semiconductor devices by enhancing selective deposition are described. In some embodiments, a blocking layer is deposited on a metal surface before deposition of a barrier layer. A substrate with a metal surface, a dielectric surface and an aluminum oxide surface has a blocking layer deposited on the metal surface using an alkylsilane.

19 Claims, 3 Drawing Sheets

Related U.S. Application Data which is a division of application No. 16/632,164, filed as application No. PCT/US2018/042467 on Jul. 17, 2018, now Pat. No. 11,417,515.

(60) Provisional application No. 63/410,721, filed on Sep. 28, 2022, provisional application No. 62/533,890, filed on Jul. 18, 2017.

(51) Int. Cl.

| | | |
|---|---|---|
| *C23C 16/30* | (2006.01) | |
| *C23C 16/455* | (2006.01) | |
| *H10P 14/60* | (2026.01) | |
| *H10P 14/68* | (2026.01) | |
| *H10P 14/694* | (2026.01) | |
| *H10P 50/28* | (2026.01) | |

(52) U.S. Cl.

CPC .... *C23C 16/45525* (2013.01); *H10P 14/6339* (2026.01); *H10P 14/6514* (2026.01); *H10P 14/6682* (2026.01); *H10P 14/683* (2026.01); *H10P 50/287* (2026.01)

(56) References Cited

U.S. PATENT DOCUMENTS

| | | | | |
|---|---|---|---|---|
| 2003/0104227 | A1* | 6/2003 | McCarthy | C09D 183/04 427/255.18 |
| 2004/0213971 | A1 | 10/2004 | Colburn et al. | |
| 2007/0029260 | A1 | 2/2007 | Wismer et al. | |
| 2007/0292604 | A1* | 12/2007 | Dordi | H01L 21/67161 427/532 |
| 2008/0213997 | A1 | 9/2008 | Lee et al. | |
| 2011/0117328 | A1 | 5/2011 | Ivanov | |
| 2012/0088369 | A1* | 4/2012 | Weidman | G03F 7/094 430/296 |
| 2012/0312191 | A1 | 12/2012 | Hood et al. | |
| 2014/0206192 | A1 | 7/2014 | Yeom et al. | |
| 2015/0099375 | A1 | 4/2015 | Haripin | |
| 2016/0141294 | A1* | 5/2016 | Peri | H01L 21/28512 438/653 |
| 2016/0270237 | A1 | 9/2016 | Cho et al. | |
| 2017/0069527 | A1 | 3/2017 | Haukka et al. | |
| 2017/0330794 | A1* | 11/2017 | Hourani | H01L 23/528 |
| 2018/0198006 | A1 | 7/2018 | Greer et al. | |

FOREIGN PATENT DOCUMENTS

| | | | | |
|---|---|---|---|---|
| KR | 20100123741 | A | 11/2010 | |
| KR | 20160002391 | A | 1/2016 | |
| KR | 20160132804 | A | 11/2016 | |
| KR | 20170016310 | A | 2/2017 | |
| TW | 200525642 | A | 8/2005 | |
| TW | 200711038 | A | 3/2007 | |
| WO | WO-2016105402 | A1 * | 6/2016 | ....... H01L 21/76807 |
| WO | 2016178978 | A1 | 11/2016 | |
| WO | 2017/048911 | A1 | 3/2017 | |

OTHER PUBLICATIONS

"Functionalization of H-terminated Si(111) with 1,2-epoxy-9-decene", Emerging Researchers National (ERN) Conference, Feb. 2017. [Retrieved on Jul. 7, 2017.] Retrieved from the Internet: <URL: http://new.emerging-researchers.org/projects/13024/>, 2 pages.

"PCT International Search Report and Written Opinion in PCT/US2018/042467 dated Oct. 31, 2018, 10 pages".

Arkles, Barry , et al., "Hydridosilane Modification of Metals: An Exploratory Study", Journal of Adhesion Science and Technology 26 (2012), pp. 41-54.

Ciampi, Simone , et al., "Functionalization of Acetylene-Terminated Monolayers on Si(100) Surfaces: A Click Chemistry Approach", Langmuir, vol. 23, No. 18, (2007), pp. 9320-9329.

Coats, Steven J., et al., "Trimethylsilyl-Directed 1,3-Dipolar Cycloaddition Reactions in the Solid-Phase Synthesis of 1,2,3-Triazoles", Organic Letters, vol. 7, No. 8, (2005), pp. 1469-1472.

Jeanquartier, Claire , et al., "A Two-Step Method to Covalently Bind Biomolecules to Group-IV Semiconductors: Si(111)/1,2-Epoxy-9-decene/Esterase", Langmuir, vol. 24, No. 24, 2008, pp. 13957-13961.

Kloss, Florian , et al., "Metal-Free 1,5-Regioselective Azide-Alkyne [3+2]-Cycloaddition", Chem. Asian J. (2011), 6, pp. 2816-2824.

Okamoto, Noriko , et al., "Cleavage of Carbon-Carbon Triple Bond: Direct Transformation of Alkynes to Nitriles", Organic Letters, vol. 15, No. 11, (Year: 2013), pp. 2571-2573.

Wang, Teng , et al., "Direct Approaches to Nitriles via Highly Efficient Nitrogenation Strategy through C—H or C—C Bond Cleavage", Acc. Chem. Res. (2014), 47, pp. 1137-1145.

Ziarani, Ghodsi Mohammadi, et al., "Advances in click chemistry for silica-based material construction", RSC Advances, 2016, 6, pp. 21979-22006.

* cited by examiner

SELECTIVE TANTALUM NITRIDE DEPOSITION FOR BARRIER APPLICATIONS

CROSS-REFERENCE TO RELATED APPLICATIONS

This application claims priority to United Stated Provisional Application No. 63/410,721, filed Sep. 28, 2022, and this application is a Continuation-In-Part of U.S. patent application Ser. No. 17/873,793, filed Jul. 26, 2022, which is a Divisional application of U.S. application Ser. No. 16/632,164, filed on Jan. 17, 2020, now U.S. Pat. No. 11,417,515 issued Aug. 16, 2022, which is the National Stage entry of PCT/US2018/042467, filed on Jul. 17, 2018, which claims priority to U.S. Provisional Application Ser. No. 62/533,890, filed Jul. 18, 2017, the entire disclosures of which are hereby incorporated by reference herein in their entireties.

TECHNICAL FIELD

Embodiments of the disclosure relate methods for depositing blocking layers on metal surfaces. More particularly, embodiments of the disclosure are directed to methods of depositing blocking layers on metal surfaces to facilitate the deposition of tantalum nitride on only dielectric surfaces.

BACKGROUND

The semiconductor industry faces many challenges in the pursuit of device miniaturization which involves rapid scaling of nanoscale features. Such issues include the introduction of complex fabrication steps such as multiple lithography steps and integration of high-performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor. For example, a self-assembled monolayer (SAM) can be formed on a surface to prevent subsequent deposition on that surface.

Current state of the art self-assembled monolayers do not inhibit growth of tantalum nitride barrier layers on tungsten surfaces. With oxygen and nitrogen based bifunctional SAMs, growth of tantalum nitride on metallic tungsten can be reduced. However, bifunctional SAMs also inhibit tantalum nitride growth on aluminum oxide surface, which are frequently used as etch stop layers in electronic devices. Inhibition of the tantalum nitride barrier on the aluminum oxide layer results in reduced electrical performance of the electronic devices.

Accordingly, there is an ongoing need in the art for methods to improve nitride deposition selectivity.

SUMMARY

One or more embodiments of this disclosure relate to a method of selectively depositing a blocking layer. The method comprises exposing a substrate having a metal surface and an aluminum oxide surface to an alkylsilane to form a blocking layer selectively on the metal surface, the alkylsilane comprising at least one compound with a general formula $SiH_3R$, where R comprises a C1-C22 alkyl group.

Additional embodiments of this disclosure relate to methods of selectively depositing a barrier layer. The method comprises exposing a substrate having a metal surface and an aluminum oxide surface to an alkylsilane comprising at least one compound with the general formula $SiH_3R$, where R comprises a C1-C22 alkyl group. A tantalum nitride barrier layer is deposited on the aluminum oxide layer

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
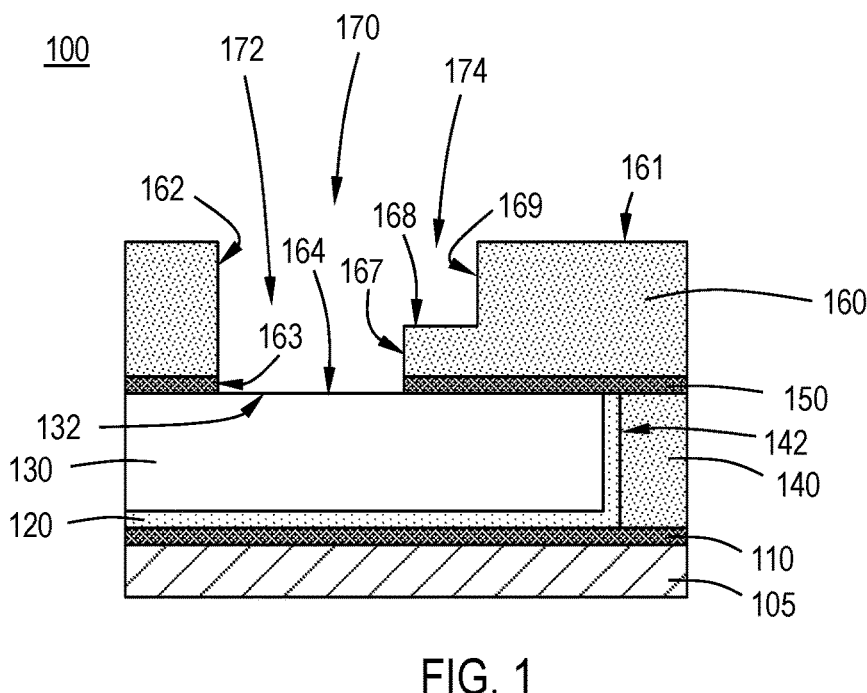
FIG. 1 shows a cross-sectional schematic representation of an electronic device prior to a selective deposition process according to one or more embodiment of the disclosure.

Embodiments of the disclosure provide methods for depositing blocking layers on metal surfaces. Embodiments of the disclosure identify methods for depositing blocking layers which may be used separately or in conjunction.

Embodiments of the disclosure provide methods for advantageously depositing barrier materials (e.g. TaN) on dielectric surfaces by blocking deposition of barrier materials on metal surfaces through blocking layers deposited on the metal surfaces.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as rectangular or square panes. In some embodiments, the substrate comprises a rigid discrete material.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

A generic process flow of the method according to one or more embodiments of the disclosure is described with respect to FIGS. 1 to 5. The methods described herein can be used to form semiconductor devices or interconnects for semiconductor devices. An interconnect, as used in this manner, is a conductive portion of an electronic device that allows electrical connection between different layers of the electronic device.

FIG. 1 illustrates an exemplary embodiment of an electronic device 100. The skilled artisan will recognize that the illustrated embodiment is merely exemplary of one possible configuration and that the scope of the disclosure is not limited to the illustrated electronic device structure.

The electronic device 100 illustrated in FIG. 1 has a substrate 105 with a first layer 110 formed thereon. Substrate 105 can be any suitable substrate material for use with an electronic device. In some embodiments, the substrate 105 can include additional layers of dielectrics, metals, etch stop layers and semiconductor layers including underlying circuits (e.g., transistors, capacitors) that have been formed in prior processes.

Those skilled in the art will understand that the use of ordinals such as "first" and "second" to describe different layers or films does not imply a specific location or number within the electronic device, or order an order of formation. A "second" layer of a material can be formed without a "first" layer being present. The ordinals are used for descriptive purposes when referring to the Figures.

The first layer 110 is an optional layer. In some embodiments, the first layer 110 is omitted. In some embodiments, the first layer 110 is made up of a lamination of more than one layer. The first layer 110 can have any suitable function including but not limited to acting as an etch stop layer for previous or future manufacturing operations.

A first dielectric layer 140 is formed on a portion of the first layer 110. The first dielectric layer 140 has an inner sidewall 142 which defines a boundary of the first dielectric layer 140, leaving an opening. The opening can be, for example, a trench for a first metallization layer of the electronic device.

The first dielectric layer 140 can be any suitable material formed by any suitable technique known to the skilled artisan. In some embodiments, the first dielectric layer 140 comprises one or more of an oxide or nitride. In some embodiments, the first dielectric layer 140 comprises silicon oxide. The first dielectric layer 140 of some embodiments is deposited by one or more of chemical vapor deposition (CVD), atomic layer deposition (ALD), plasma-enhanced chemical vapor deposition (PECVD), plasma-enhanced atomic layer deposition (PEALD), physical vapor deposition (PVD) or spin-on techniques.

The dielectric surface of the first dielectric layer 140 on the substrate 105 may comprise any suitable dielectric materials. Suitable dielectric materials include, but are not limited to, oxides (e.g., silicon oxides) and high-k dielectrics. In some embodiments, the dielectric surface consists essentially of silicon oxide. As used in this manner, the term "consists essentially of" means that the surface is greater than or equal to about 95%, 98% or 99% of the stated material, on an area basis. In some embodiments, the first dielectric layer 140 comprises one or more of $SiO_2$, SiN, SiCON, SiCO, $Al_2O_3$ or AlN.

A liner 120 is formed on the top surface of the first layer 110 and abutting the inner sidewall 142 of the first dielectric layer 140. The liner 120 of some embodiments acts as one or more of an adhesion layer, barrier layer or liner. The liner 120 can be any suitable material, including, but not limited to, oxides and nitrides. The liner 120 can be formed by any suitable technique known to the skilled artisan. In some embodiments, the liner 120 is formed as a conformal film by atomic layer deposition.

A first metal layer 130 is formed on the liner 120 and forms a first metallization layer. The first metal layer can be any suitable material known to the skilled artisan deposited by any suitable technique. Suitable metal materials include, but are not limited to, metals, metal nitrides, metal alloys, and other conductive materials. In some embodiments, the metal surface comprises one or more of copper, cobalt, tungsten, molybdenum, ruthenium or titanium nitride. In some embodiments, the metal surface consists essentially of cobalt. In some embodiments, the metal surface consists essentially of tungsten. In some embodiments, the metal surface consists essentially of titanium nitride.

An etch stop layer 150 is formed on the first metal layer 130. The etch stop layer 150 can be any suitable material formed by any suitable technique known to the skilled artisan. In some embodiments, the etch stop layer 150 comprises aluminum oxide ($Al_2O_3$). In some embodiments, the etch stop layer 150 consists essentially of aluminum oxide.

A second dielectric layer 160 is formed on the etch stop layer 150. The second dielectric layer 160 can be any suitable material formed by any suitable technique known to the skilled artisan. In some embodiments, the second dielectric layer 160 comprises one or more of an oxide or nitride. In some embodiments, the second dielectric layer 160 comprises silicon oxide. The second dielectric layer 160 of some embodiments is deposited by one or more of chemical vapor deposition (CVD), atomic layer deposition (ALD), plasma-enhanced chemical vapor deposition (PECVD), plasma-enhanced atomic layer deposition (PEALD), physical vapor deposition (PVD) or spin-on techniques.

The second dielectric layer 160 comprises a different material than the etch stop layer 150. The dielectric surface of the second dielectric layer 160 may comprise any suitable dielectric materials. Suitable dielectric materials include, but are not limited to, oxides (e.g., silicon oxides) and high-k dielectrics. In some embodiments, the dielectric surface consists essentially of silicon oxide. In some embodiments, the second dielectric layer 160 comprises one or more of SiO$_2$, SiN, SiCON, SiCO, Al$_2$O$_3$ or AlN. In some embodiments, the second dielectric layer 160 comprises the same material as the first dielectric layer 140. In some embodiments, the second dielectric layer 160 comprises a different material than the first dielectric layer 140.

The substrate comprising the second dielectric layer 160, etch stop layer 150 and first metal layer 130 have a feature 170 formed therein. The feature 170 is formed in the second dielectric layer 160 and the etch stop layer 150 exposing a top surface 132 of the first metal layer 130. The feature 170 illustrated has a via portion 172 and a trench portion 174.

The via portion 172 extends through the second dielectric layer 160 and the etch stop layer 150 to the first metal layer 130. The via portion exposes a top surface 132 of the first metal layer 130. The top surface of the first metal layer 130 forms the bottom surface 164 of the via portion 172. The via portion 172 is bounded on one side by the sidewall 162 of the second dielectric layer 160 and the sidewall 163 of the etch stop layer 150. The via portion 172 is bounded on another side by a lower sidewall 167 of the second dielectric layer 160 and the sidewall 163 of the etch stop layer 150. The skilled artisan will recognize that the via portion 172 may have a circular cross-section and that the use of a first side and a second side to describe the via portion 172 is for descriptive purposes based on the cross-sectional views in the Figures. When the via portion 172 is a cylindrical hole, the sidewalls of the dielectric layer and the etch stop layer are continuous so that there is effectively a single sidewall, rather than a first side and second side that appears in the cross-section.

The trench portion 174 has a bottom surface 168 formed from the second dielectric layer 160 and is bounded on one side by upper sidewall 169 which comprises the second dielectric layer 160 material. The trench portion 174 has an open side where the via portion 172 passes through the second dielectric layer 160 and etch stop layer 150.

Embodiments of the disclosure advantageously provide methods for surface pretreatment, such as selective blocking of metal surfaces (including but are not limited to copper, cobalt, tungsten, tantalum, tantalum nitride, tantalum oxide, titanium, titanium oxide, titanium nitride, ruthenium, ruthenium oxide and iridium etc.). Some embodiments advantageously provide methods to selectively grow a dielectric material on a dielectric surface such as SiO$_2$, SiN, SiCON, SiCO, etc. Some embodiments advantageously provide methods to selectively block surface deposition using epoxide surface reactions.

The embodiment illustrated in FIG. 1 is the substrate for further deposition processes. The etch stop layer 150 in the illustrated embodiment is aluminum oxide, and the surface (sidewall 163) of the etch stop layer 150 is an aluminum oxide surface. The substrate has a metal surface (the bottom surface 164 of the via portion 172), a dielectric surface (sidewall 162, lower sidewall 167, bottom surface 168, upper sidewall 169, and top surface 161) and an aluminum oxide surface (sidewall 163 of etch stop layer 150).

Figure 2:
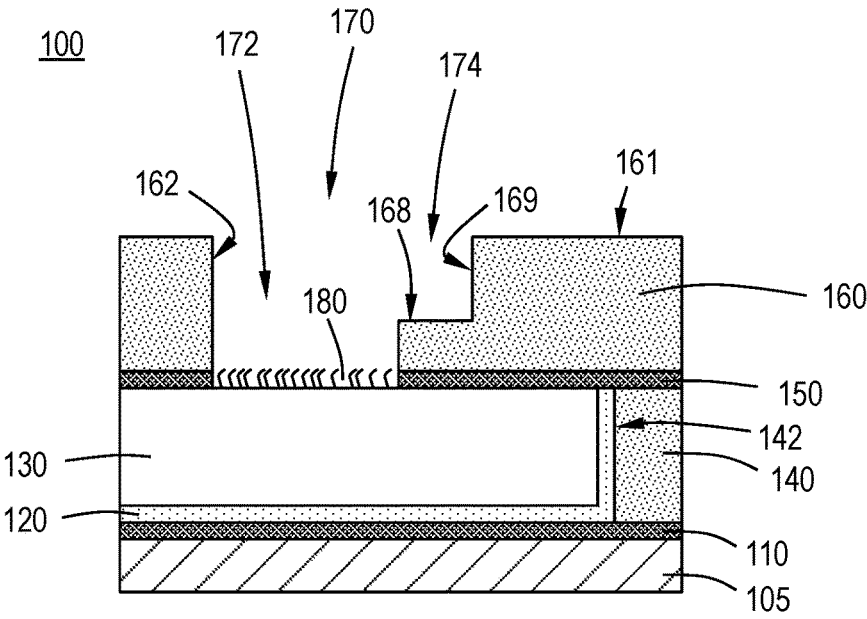
FIG. 2 shows a cross-sectional schematic representation of the electronic device of FIG. 1 after formation of a blocking layer in accordance with one or more embodiments of the disclosure.

FIG. 2 illustrates the electronic device 100 of FIG. 1 after selectively depositing a blocking layer 180. The substrate comprising the metal surface, dielectric surface and aluminum oxide surface is exposed to a silane to form the blocking layer 180. The blocking layer 180 forms selectively on the metal surface (the bottom surface 164 of the via portion 172).

The blocking molecule (a silane) used to deposit the blocking layer 180 in some embodiments comprises at least one compound (blocking molecule) with a general formula SiH$_3$R, where R is selected from C1-C22 alkyl groups. As used in this manner, the letter "C" followed by a numeral (e.g., "C4") means that the substituent comprises the specified number of carbon atoms (e.g., C4 comprises four carbon atoms). The blocking layer 180 is a metal silicide that is formed selectively on the metal surface.

In some embodiments, a metal silicide is selectively formed on a metal surface over a dielectric surface and aluminum oxide surface. As used in this specification and the appended claims, the phrase "selectively over", or similar, means that the subject material is deposited on the stated surface to a greater extent than on another surface. In some embodiments, "selectively" means that the subject material forms on the selective surface at a rate greater than or equal to 10×, 15×, 20×, 25×, 30×, 35×, 40×, 45× or 50× the rate of formation on the non-selected surface.

In some embodiments, a long alkyl chain containing trihydridosilane (RSiH$_3$ where R═C4-C20) is used as a blocking molecule and is reacted with a metal surface (including but not limited to Cu, Co, W, and TiN) in solution or vapor phase. In some embodiments, the metal surface is cleaned prior to reaction with the blocking molecule. Organosilanes react with the metal surface selectively over a dielectric surface (e.g., SiO$_2$) and aluminum oxide surface (sidewall 163 of etch stop layer 150) through the silane head group. The organic portion of the silane acts as a hydrophobic protecting layer which blocks the growth of a subsequent dielectric layer (e.g., SiN) on metals enabling selective deposition of a dielectric on the dielectric surface.

One or more embodiments of this disclosure are directed to methods of selectively depositing a blocking layer on a metal surface of a substrate having a metal surface and a dielectric surface. The method comprises exposing the substrate to a silane comprising at least one compound with a general formula SiH$_3$R, where R is selected from C4-C20 alkyl, perfluoroalkyl, alkenyl or alkynyl groups. In some embodiments, the substituent can be straight chain groups (e.g. n-butyl), branched groups (e.g. t-butyl) or cyclic groups (e.g. cyclohexyl).

The dielectric surface of the substrate may comprise any suitable dielectric materials. Suitable dielectric materials include, but are not limited to, oxides (e.g., silicon oxides) and high-k dielectrics. In some embodiments, the dielectric surface consists essentially of silicon oxide. As used in this manner, the term "consists essentially of" means that the surface is greater than or equal to about 95%, 98% or 99% of the stated material, on an area basis.

The metal surface of the substrate may comprise any suitable metal materials. Suitable metal materials include, but are not limited to, metals, metal nitrides, metal alloys, and other conductive materials. In some embodiments, the metal surface comprises one or more of cobalt, tungsten or titanium nitride. In some embodiments, the metal surface consists essentially of cobalt. In some embodiments, the metal surface consists essentially of tungsten. In some embodiments, the metal surface consists essentially of titanium nitride.

The silane exposed to the substrate may comprise any suitable trihydridosilanes. In some embodiments, the silane comprises at least one compound with a general formula SiH$_3$R, where R is selected from C4-C20 alkyl, perfluoroalkyl, alkenyl or alkynyl groups. In some embodiments, C4-C20 alkyl groups consist essentially of one Si—C bond, C—C single bonds and C—H bonds. In some embodiments, C4-C20 perfluoroalkyl groups consist essentially of one Si—C bond, C—C single bonds and C—F bonds. In some embodiments, C4-C20 alkenyl groups consist essentially of one Si—C bond, C—C single bonds, at least one C—C double bond and C—H bonds. In some embodiments, C4-C20 alkynyl groups consist essentially of one Si—C bond, C—C single bonds, at least one C—C triple bond and C—H bonds. In some embodiments, the C4-C20 group includes one or more halogen atom and/or hydrophobic moiety.

In some embodiments, the silane comprises C4-C20 alkyl groups. In some embodiments, the silane comprises dodecylsilane ($C_{12}H_{25}SiH_3$). In some embodiments, the silane consists essentially of dodecylsilane.

In some embodiments, forming the blocking layer 180 comprises exposing soaking the substrate in the blocking chemistry. In some embodiments, forming the blocking layer 180 comprises exposing the substrate to pulses of the blocking chemistry (e.g., a silane). The pulses of blocking chemistry can be any suitable duration and occur any suitable number of times. In some embodiments, during formation of the blocking layer 180 occurs with greater than 1, 10, 100, 250, 500 or 1000 pulses of blocking layer chemistry. In some embodiments, the total time for exposure to the blocking chemistry is greater than 1 second, 10 seconds, 100 seconds, 500 seconds or 1000 seconds.

In some embodiments, the silane groups cross-link with each other after deposition. In some embodiments, the blocking layer contains substantially no crosslinking between the silane groups. As used in this manner, the term "substantially no crosslinking" means that there is less than or equal to about 5%, 2% or 1% crosslinking on a surface area basis.

In some embodiments, the substrate is cleaned prior to exposing the substrate to the silane. In some embodiments, only the metal surface of the substrate is cleaned prior to exposing the substrate to the silane. In some embodiments, the substrate or the metal surface of the substrate is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma comprises plasma of $H_2$. In some embodiments, the hydrogen plasma comprises or consists essentially of a combination of argon (Ar) and hydrogen ($H_2$). In some embodiments, the hydrogen plasma comprises or consists essentially of a combination of helium (He) and hydrogen ($H_2$).

In some embodiments, the liner 190 is a dielectric layer that is selectively deposited on the dielectric surface after deposition of the blocking layer. In some embodiments, the dielectric layer comprises silicon nitride. Deposition of silicon nitride can be performed through any suitable process. Suitable processes may include exposure of the substrate to a silicon halide and ammonia. Suitable silicon halides include, but are not limited to dichlorosilane (DCS), trichlorosilane (TCS), tetrachlorosilane ($SiCl_4$), tetrabromosilane ($SiBr_4$), tetraiodosilane ($SiI_4$), and hexachlorodisilane (HCDS).

In some embodiments, the liner 190 comprises or consists essentially of tantalum nitride (TaN). In some embodiments, the tantalum nitride is deposited by a thermal atomic layer deposition (ALD) process. As used in this manner, a thermal process does not include a plasma. In some embodiments, the tantalum nitride is deposited using pentakis(dimethyl-amino)tantalum (PDMAT) and ammonia in a thermal ALD process.

In some embodiments, exposing the substrate to the silane is repeated after deposition of the dielectric layer to regenerate the blocking layer. In some embodiments, the dielectric layer is deposited again after the blocking layer is regenerated. In some embodiments, exposure of the substrate to a silane and depositing a silicon nitride layer is repeated until the silicon nitride layer has reached a predetermined thickness.

The exposure to the surface blocking chemistry, or blocking layer regeneration, can be performed once or repeated after a number of deposition cycles or after a predetermined film thickness is formed. In some embodiments, a liner 190 is deposited with a thickness in the range of about 5 Å to about 50 Å, or in the range of about 10 Å to about 40 Å, or in the range of about 15 Å to about 35 Å before the blocking layer 180 is regenerated.

The blocking layer 180 is formed at a temperature that is favorable to close packing of the self-assembled monolayer of blocking chemistry species. In some embodiments, the substrate is maintained at a temperature in the range of 100° C. to 500° C., or in the range of 150° C. to 450° C., or in the range of 200° C. to 400° C., or in the range of 225° C. to 350° C., or in the range of 250° C. to 350° C., or in the range of 250° C. to 300° C.

Some embodiments of the disclosure are directed to deposition of selective liners on dielectric surfaces relative to metal surfaces. Selective liners (e.g., tantalum nitride) can reduce the RC delay by >50%. Current processes deposit TaN selectively on copper using known SAMs for the N3 technology node. For next generation devices, selective deposition of tantalum nitride on dielectric relative to tungsten metal.

Embodiments of the disclosure advantageously provide methods for surface pretreatment, such as selective blocking of metal surfaces (including but are not limited to copper, cobalt, tungsten, tantalum, tantalum nitride, tantalum oxide, titanium, titanium oxide, titanium nitride, ruthenium, ruthenium oxide and iridium etc.). Some embodiments advantageously provide methods to selectively grow a barrier material on a dielectric surface such as silicon oxide ($SiO_x$), silicon nitride (SiN), silicon carboxynitride (SiCON), silicon oxycarbide (SiCO), etc.

In some embodiments, the silane comprises C1-C22 alkyl groups. In embodiments, the silane comprises at least one C2-C22, or C3-C22, or C4-C22, or C5-C22, or C6-C22 alkyl group. In some embodiments, the silane comprises one alkyl group having in the range of 1 to 22, 2 to 22, 3 to 22, 4 to 22, 5 to 22, or 6 to 22 carbon atoms. In some embodiments, the silane comprises dodecylsilane ($C_{12}H_{25}SiH_3$). In some embodiments, the silane consists essentially of dodecylsilane. In some embodiments, the silane consists essentially of octylsilane ($C_8H_{17}SiH_3$). In some embodiments, the silane consists essentially of octadecylsilane ($C_{18}H_{37}SiH_3$).

In some embodiments, the silane comprises a compound with the general formula $R_{4-n}SiH_n$, where n is 1 to 3 and R comprises C1-C22 alkyl groups, or at least one C2-C22, or C3-C22, or C4-C22, or C5-C22, or C6-C22 alkyl group. In some embodiments, the silane comprises one alkyl group having in the range of 1 to 22, 2 to 22, 3 to 22, 4 to 22, 5 to 22, or 6 to 22 carbon atoms. In some embodiments, n is 1. In some embodiments, n is 2. In some embodiments, n is 3.

In some embodiments, the silane groups cross-link with each other after deposition. In some embodiments, the blocking layer 180 contains substantially no crosslinking between the silane groups. As used in this manner, the term "substantially no crosslinking" means that there is less than or equal to about 5%, 2% or 1% crosslinking on a surface area basis.

In some embodiments, the substrate is pre-cleaned prior to exposing the substrate to the silane. In some embodiments, only the metal surface of the substrate is cleaned prior to exposing the substrate to the silane, for example, by forming a protective layer on the dielectric surfaces. In some embodiments, the substrate or the metal surface of the substrate is subjected to pre-cleaning with a hydrogen plasma prior to formation of the blocking layer 180. In some embodiments, the hydrogen plasma is a conductively coupled plasma (CCP). In some embodiments, the hydrogen plasma is an inductively coupled plasma (ICP). In some embodiments, the hydrogen plasma comprises plasma of $H_2$.

Pre-cleaning of the substrate can occur at any suitable temperature depending on, for example, the cleaning technique. In some embodiments, pre-cleaning of the substrate occurs at a temperature in the range of 200° C. to 500° C., or in the range of 300° C. to 400° C.

Figure 3:
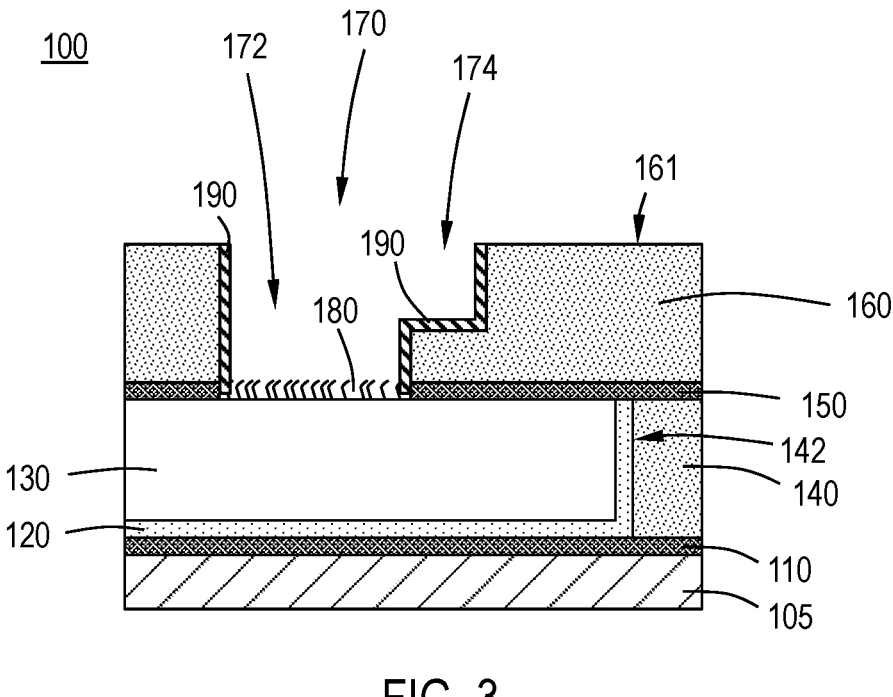
FIG. 3 shows a cross-sectional schematic representation of the electronic device of FIG. 2 after formation of a liner in accordance with one or more embodiments of the disclosure.

FIG. 3 shows the electronic device 100 of FIG. 2 after formation of a liner 190 on the surfaces of the second dielectric layer 160 and etch stop layer 150. The liner 190 of some embodiments comprises or consists essentially of tantalum nitride. In some embodiments, the first metal layer 130 comprises tungsten, the etch stop layer 150 comprises aluminum oxide and the second dielectric layer 160 comprises silicon oxide, and the liner 190 comprises tantalum nitride.

In some embodiments, the metal surface (first metal layer 130 and bottom surface 164) comprises tungsten. In some embodiments, the metal surface (first metal layer 130 and bottom surface 164) consists essentially of tungsten. In some embodiments, the metal surface (first metal layer 130 and bottom surface 164) comprises cobalt. In some embodiments, the metal surface (first metal layer 130 and bottom surface 164) consists essentially of cobalt.

In some embodiments, the liner 190 is selectively deposited on the top surface 161, sidewall 162, lower sidewall 167, bottom surface 168, upper sidewall 169 of the second dielectric layer 160 in the feature 170 and the surface (sidewall 163) of the etch stop layer 150 after formation of the SAM blocking layer 180 on the underlying metal surface (bottom surface 164 of via portion 172). Stated differently, the liner 190 is deposited on the sidewall 162, sidewall 163 of the via portion 172 and the bottom surface 168 and upper sidewall 169 of the trench portion 174 of the feature 170. In some embodiments, the liner 190 forms on the sidewalls to the blocking layer 180 on the metal surface. In some embodiments, a small gap is formed between the bottom surface 164 of the via portion 172 and the bottom edge of the liner 190 due to the presence of the blocking layer 180.

In some embodiments, the liner 190 comprises tantalum nitride. In some embodiments, the liner 190 consists essentially of tantalum nitride. Deposition of tantalum nitride can be performed by any suitable process known to the skilled artisan. In some embodiments, the liner 190 comprises one or more of tantalum nitride (TaN), titanium nitride (TiN), silicon nitride (SiN), titanium silicon nitride (TiSiN), tantalum silicon nitride (TaSiN) or silicon oxynitride (SiON).

In the embodiment illustrated in the Figures, the liner 190 is formed on the sidewall 162 of the via portion 172, the lower sidewall 167, bottom surface 168 and upper sidewall 169 of the trench portion 174 of the feature 170. The Figures do not show liner 190 material on the top surface 161 of the second dielectric layer 160. In some embodiments, deposition of the liner 190 results in formation of the liner 190 on the top surface 161 of the second dielectric layer 160. The substrate is then subjected to a process to remove the liner 190 from the top surface 161 of the second dielectric layer 160, for example, by chemical mechanical planarization (CMP).

SAM (blocking layer 180) formation on clean substrates comprising W, Si, $SiO_2$ and $Al_2O_3$ surfaces at different temperatures were subjected to a tantalum nitride deposition process. The tantalum nitride layer formed on each of the surfaces indicated that less than 5 Å of TaN forms on a W surface while greater than 18 Å forms on the $Al_2O_3$, $SiO_2$ and Si surfaces after 1000 deposition cycles. In some embodiments, the SAM is reformed on the metal surface after less than or equal to 1000, 500, 400, 300, 200 or 100 cycles of TaN deposition.

In some embodiments, the liner 190 is formed to a thickness in the range of 5 Å to 25 Å without reforming the blocking layer 180. In some embodiments, when 20 Å of tantalum nitride is formed on the dielectric surface and the aluminum oxide surface, less than or equal to 4 Å of tantalum nitride is formed on the metal surface.

Figure 4:
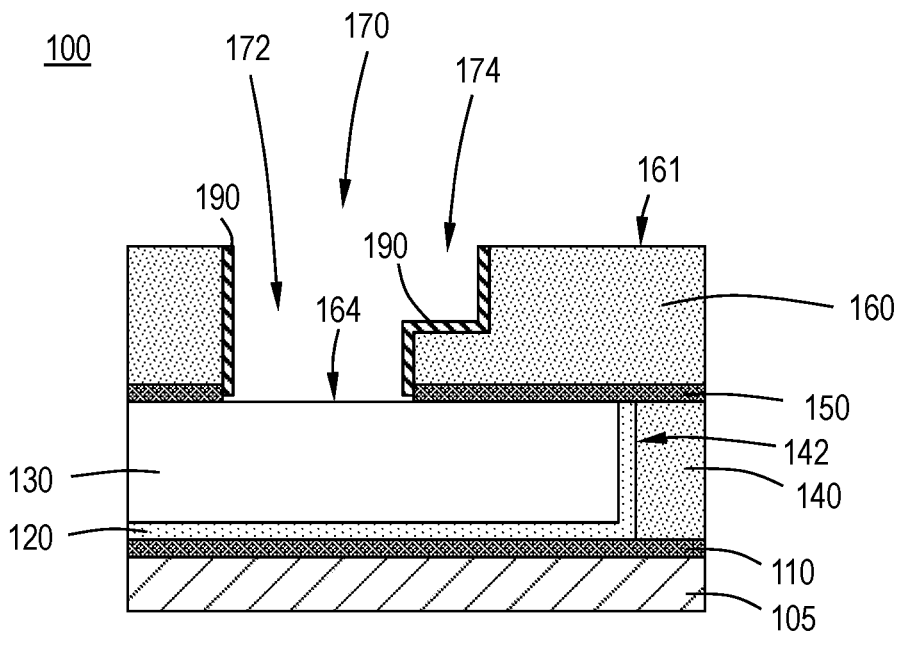
FIG. 4 shows a cross-sectional schematic representation of the electronic device of FIG. 3 after removal of the blocking layer in accordance with one or more embodiments of the disclosure.

FIG. 4 shows the electronic device 100 of FIG. 3 after removal of the blocking layer 180 to expose the bottom surface 164 of the via portion 172, which is the top surface of the first metal layer 130. Removing the blocking layer 180 can be done by any suitable technique known to the skilled artisan.

In some embodiments, removing the blocking layer 180 results in a small gap between the top surface of the first metal layer 130 (bottom surface 164 of the via portion 172). This gap is negligible and does not affect subsequent processes. In some embodiments, removal of the blocking layer 180 results in substantially no gap between the top surface of the first metal layer 130 and the bottom edge of the liner 190.

Figure 5:
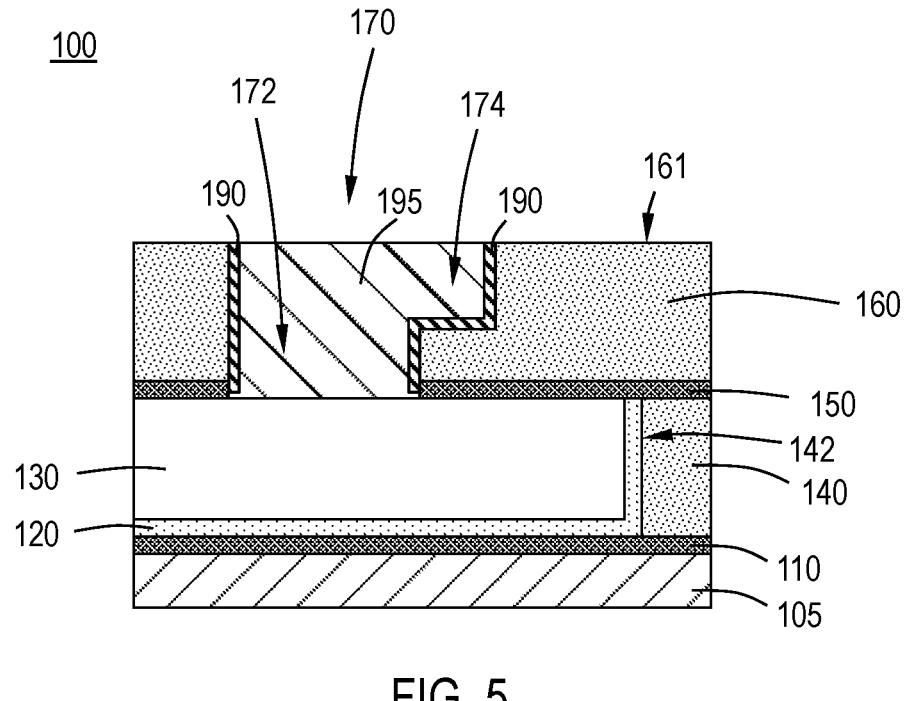
FIG. 5 shows a cross-sectional schematic representation of the electronic device of FIG. 4 after formation of a second metal layer in accordance with one or more embodiments of the disclosure.

FIG. 5 illustrates the electronic device of FIG. 4 after deposition of a second metal layer 195 in the feature 170. The second metal layer 195 is formed on the top surface of the first metal layer 130 (bottom surface 164 of the via portion 172). The second metal layer 195 deposits on the liner 190 on the second dielectric layer 160 and the etch stop layer 150. In some embodiments, the liner 190 comprises tantalum nitride, the etch stop layer 150 comprises aluminum oxide, the second dielectric layer comprises silicon oxide, the first metal layer 130 comprises tungsten, and the second metal layer 195 forms on the top surface of the first metal layer 130 that is exposed through the via portion 172 of the feature 170, the liner 190 on the sidewall 162 of the via portion 172, and on the liner 190 of the lower sidewall 167, bottom surface 168 and upper sidewall 169 of the trench portion 174.

In some embodiments, a blanket deposition process deposits a second metal layer 195 into the feature 170 and on the top surface 161 of the second dielectric layer 160. The second metal layer 195 formed on the top surface 161 of the second dielectric layer 160 can be removed by any suitable technique including, but not limited to, etching and chemical mechanical planarization.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor device, the method comprising exposing a substrate having a first metal layer with a top surface, a dielectric surface, and an aluminum oxide surface to a silane to selectively form a blocking layer on an exposed top surface of the first metal layer to a greater extent than on an exposed dielectric surface and an exposed aluminum oxide surface, the silane comprising at least one compound with a general formula $R_{4-n}SiH_n$, where R is selected from C1-C22 alkyl groups and n is 1 to 3.

2. The method of claim 1, wherein the silane comprises dodecylsilane ($C_{12}H_{25}SiH_3$).

3. The method of claim 1, wherein the silane comprises octylsilane ($C_8H_{17}SiH_3$).

4. The method of claim 1, wherein the blocking layer is formed with the substrate at a temperature in a range of 100° C. to 500° C.

5. The method of claim 1, wherein forming the blocking layer comprises exposing the substrate to pulses of the silane in vapor phase.

6. The method of claim 1, wherein the first metal layer comprises one or more of tungsten or cobalt.

7. The method of claim 1, further comprising selectively depositing a liner on the dielectric surface and aluminum oxide surface relative to the top surface of the first metal layer.

8. The method of claim 7, wherein the liner comprises one or more of tantalum nitride, titanium nitride, silicon nitride, titanium silicon nitride, tantalum silicon nitride or silicon oxynitride.

9. The method of claim 7, wherein the liner is deposited to a thickness in a range of 5 Å to 25 Å.

10. The method of claim 7, further comprising removing the blocking layer after selectively depositing the liner.

11. The method of claim 10, further comprising depositing a second metal layer on the top surface of the first metal layer and the liner on the dielectric surface and aluminum oxide surface.

12. The method of claim 10, further comprising pre-cleaning the substrate prior to forming the blocking layer.

13. The method of claim 12, wherein pre-cleaning the substrate comprises exposing the substrate to a hydrogen ($H_2$) plasma.

14. The method of claim 13, wherein pre-cleaning the substrate occurs at a temperature in a range of 200° C. to 500° C.

15. The method of claim 11, wherein the top surface of the first metal layer comprises tungsten and the dielectric surface comprises silicon oxide.

16. The method of claim 15, wherein the liner comprises tantalum nitride.

17. The method of claim 16, wherein when 20 Å of tantalum nitride is formed on the dielectric surface and the aluminum oxide surface, less than 4 Å of tantalum nitride is formed on the metal surface.

18. The method of claim 1, wherein forming the blocking layer comprises soaking the substrate in a solution of the silane.

19. The method of claim 1, wherein the blocking layer is not formed on the exposed dielectric surface or the exposed aluminum oxide surface.

* * * * *